(12) United States Patent
Shiobara et al.

(10) Patent No.: US 12,540,222 B2
(45) Date of Patent: Feb. 3, 2026

(54) FLUOROPLASTIC SUBSTRATE FOR HIGH-SPEED COMMUNICATIONS AND COPPER-CLAD FLUOROPLASTIC SUBSTRATE FOR HIGH-SPEED COMMUNICATIONS

(71) Applicant: Shin-Etsu Chemical Co., Ltd., Tokyo (JP)

(72) Inventors: Toshio Shiobara, Tokyo (JP); Ryunosuke Nomura, Annaka (JP); Hajime Itokawa, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 250 days.

(21) Appl. No.: 18/340,197

(22) Filed: Jun. 23, 2023

(65) Prior Publication Data
US 2023/0416482 A1 Dec. 28, 2023

(30) Foreign Application Priority Data
Jun. 24, 2022 (JP) ................. 2022-102214

(51) Int. Cl.
*C08J 5/24* (2006.01)
*C08K 3/36* (2006.01)
*H05K 1/03* (2006.01)

(52) U.S. Cl.
CPC ............. *C08J 5/244* (2021.05); *C08J 5/248* (2021.05); *C08K 3/36* (2013.01); *H05K 1/0366* (2013.01);
(Continued)

(58) Field of Classification Search
CPC ........ C08J 5/244; C08J 5/248; C08J 2327/18; C08K 3/36; C08K 2201/001; C08K 2201/005; H05K 1/0366; H05K 2201/015; H05K 2201/029; H05K 1/03; H05K 1/0373; B32B 2260/021; B32B 2260/023; B32B 2260/046; B32B 2262/10; B32B 2262/101; B32B 2307/204; B32B 2307/538; B32B 15/14; B32B 15/20
See application file for complete search history.

(56) References Cited

U.S. PATENT DOCUMENTS 11,802,192 B2 10/2023 Shiobara et al.
11,920,011 B2 * 3/2024 Shiobara .................. C08J 5/249
(Continued)

FOREIGN PATENT DOCUMENTS

JP 2-289416 A 11/1990
JP 5-170483 A 7/1993
(Continued)

OTHER PUBLICATIONS

Japanese Office Action for Japanese Application No. 2022-102214, dated Jun. 6, 2023.

*Primary Examiner* — Michael Zhang
(74) *Attorney, Agent, or Firm* — Birch, Stewart, Kolasch & Birch, LLP

(57) ABSTRACT

A fluoroplastic substrate for high-speed communications has a dielectric loss tangent at 40 GHz of from 0.0001 to 0.0008 and a permittivity at 40 GHz of from 2.0 to 3.2. The substrate includes a quartz glass cloth having a dielectric loss tangent at 40 GHz of from 0.0001 to 0.0008 and a fluoroplastic having a dielectric loss tangent at 40 GHz of from 0.0001 to 0.0005.

3 Claims, 4 Drawing Sheets

(52) U.S. Cl.
CPC ..... *C08J 2327/18* (2013.01); *C08K 2201/001* (2013.01); *C08K 2201/005* (2013.01); *H05K 2201/015* (2013.01); *H05K 2201/029* (2013.01)

(56) References Cited

U.S. PATENT DOCUMENTS

| | | | | |
|---|---|---|---|---|
| 2019/0135683 A1* | 5/2019 | Gleason | .................. | C04B 35/14 |
| 2019/0225762 A1* | 7/2019 | Tsutsumi | ............... | C03C 13/045 |
| 2022/0169832 A1* | 6/2022 | Okabe | ...................... | C01B 33/18 |
| 2023/0363090 A1* | 11/2023 | Komori | .................. | B32B 27/38 |

FOREIGN PATENT DOCUMENTS

| | | |
|---|---|---|
| JP | 2002-307611 A | 10/2002 |
| JP | 2015-111625 A | 6/2015 |
| JP | 2022-11534 A | 1/2022 |

\* cited by examiner

METHOD FOR CALCULATING DIELECTRIC LOSS TANGENT OF SILICA POWDER

FLUOROPLASTIC SUBSTRATE FOR HIGH-SPEED COMMUNICATIONS AND COPPER-CLAD FLUOROPLASTIC SUBSTRATE FOR HIGH-SPEED COMMUNICATIONS

CROSS-REFERENCE TO RELATED APPLICATIONS

This non-provisional application claims priority under 35 U.S.C. § 119(a) on Patent Application No. 2022-102214 filed in Japan on Jun. 24, 2022, the entire contents of which are hereby incorporated by reference.

TECHNICAL FIELD

The present invention relates to a fluoroplastic substrate for high-speed communications which is composed of quartz glass cloth and low-dielectric fluoroplastic and the dielectric loss tangent of which has a very low frequency dependence in the extremely high frequency (EHF) to terahertz region of the electromagnetic spectrum.

BACKGROUND ART

With the ongoing transition today to 5G and other high-speed communication technologies, there exists a strong desire for high-speed communication substrates and antenna substrates that have little transmission loss even at high frequencies such as EHF. In information devices such as smartphones, remarkable progress is being made toward achieving higher-density packaging on wiring boards and ultrathin dimensions. In high-speed substrates at frequencies above 20 GHz, ensuring signal quality through the extension of existing technology has become a challenge.

Laminates produced by impregnating cloth made of a low-dielectric glass such as D glass, NE glass or L glass with a thermoplastic resin such as fluoroplastic or polyphenylene ether or with a low-dielectric epoxy or maleimide resin to form prepregs which are then built up in layers and cured under applied heat and pressure are widely used for 5G and other high-speed communication applications. However, even with glass cloths of D glass, NE glass, L glass and the like having improved dielectric properties, all of these glasses have large dielectric loss tangents in high-frequency regions of 10 G and above that are from about 0.002 to 0.005 and moreover have large frequency dependences, making it difficult to employ such glasses in a broad range of applications as high-speed substrates for extremely high frequencies. The transmission loss of signals, as shown by the Edward A. Wolff formula (transmission loss $\propto \sqrt{\varepsilon} \times \tan \delta$), is known to improve as the permittivity ($\varepsilon$) and dielectric loss tangent (tan $\delta$) of a material become smaller.

Methods that use an inorganic powder or glass cloth, which have lower dielectric loss tangents than resins, to lower the dielectric loss tangent of organic resin substrates such as printed wiring boards are common. However, in such substrates, on a microscopic level, the resin serving as the binder and the inorganic powder or glass cloth have differing dielectric properties. Hence, even at high frequencies such as EHF, low-dielectric substrates having uniform dielectric properties cannot be obtained. In particular, substrates having uniform dielectric properties which include a dielectric loss tangent in the broad high-frequency range of 20 GHz to 100 GHz that is less than 0.0015 and a permittivity of 4.0 or less are almost unheard of.

Silica powder, which is a typical inorganic powder having low dielectric properties, and quartz glass cloth are both materials that, as an inorganic powder or a substrate reinforcing material added to resin, have low coefficients of expansion and excel as well in their insulating and dielectric properties. Although quartz glass cloth and silica powder are known to generally have excellent dielectric properties, in existing quartz glass cloths and silica powders, the dielectric loss tangent value cannot be freely adjusted.

In quartz glass and silica powder, the amount of hydroxyl groups (OH) remaining in the glass generally differs depending on the production method, heat treatment and the like. In quartz glass cloth as well, compared with the amount of hydroxyl groups in bulk quartz, the level of hydroxyl groups is known to increase in the course of processing the bulk quartz into quartz glass cloth, giving rise to disparities in various properties due to OH concentration differences. The frequency dependence and temperature dependence are higher in such quartz glass cloth, making it impossible to use the quartz glass cloth as a substrate material having the uniform dielectric properties of a dielectric loss tangent of below 0.0015 and a permittivity of 4.0 or less in the broad high-frequency region from 20 GHz to 100 GHz. JP-A H02-289416 describes the production of low-silanol silica powder by treatment under applied heat, but mentions only the percent reduction in silanol (Si—OH) groups; the amount of silanol in the silica powder following treatment is not measured nor is there any mention of a correlation with the dielectric loss tangent.

The relationship between the amount of moisture in silica glass fibers and the dielectric loss tangent is demonstrated in JP-A H05-170483, but no mention is made of the amount of silanol. With regard to the dielectric loss tangent, because this is a value measured in printed circuit boards made with glass fibers and PTFE, no light is thrown on the correlation between the amount of silanol and the dielectric loss tangent of the glass fibers. Lowering the amount of OH groups down to a given level by high-temperature treatment in order to increase the dielectric loss tangent is not known. Moreover, when quartz glass and silica powder are heat-treated at a high temperature, because the amount of strain increases, with strain at the glass surface in particular increasing, microcrack formation occurs, which greatly lowers the strength. This approach is thus unsuitable for practical use.

Other ways of lowering the dielectric loss tangent of organic resin substrates for printed circuit boards and the like are described in JP-A 2015-111625 and JP-A 2002-307611, which disclose fluoroplastic substrates that use polytetrafluoroethylene (PTFE), which has a lower dielectric loss tangent than the aforementioned glass cloth and a small transmission loss, as the organic resin.

JP-A 2015-111625 describes a method for further lowering the dielectric loss tangent of a fluoroplastic substrate in which, because fluoroplastic has a lower dielectric loss tangent than glass cloth, the substrate is designed so as to make the glass cloth layer thinner and the fluoroplastic layer thicker, thereby increasing the volume fraction of the fluoroplastic. However, given that there exists a large difference between the dielectric loss tangents of the binder and the glass cloth and that the ratio between the two volume fractions tends more toward the binder side, a worsening in the dielectric properties at extremely high frequency (EHF) and above cannot be suppressed. Hence, this prior-art substrate cannot be used as a fluoroplastic substrate for high-speed communications that has a dielectric loss tangent with very low frequency dependence in the EHF to terahertz region.

JP-A 2002-307611, which discloses a low-dielectric fluoroplastic substrate made using a low-dielectric glass cloth and a fluoroplastic, describes a fluoroplastic substrate that has been formed as a composite of quartz glass and fluoroplastic. However, as noted above, the dielectric loss tangent of quartz glass cloth cannot be freely adjusted. Hence, no mention is made of the frequency dependence of the quartz cloth, nor is there any mention of a fluoroplastic substrate for high-speed communications which has a low dielectric loss tangent and a specific permittivity at 40 GHz.

Therefore, a fluoroplastic substrate for high-speed communications which combines a quartz glass cloth having a specific dielectric loss tangent with a fluoroplastic having a specific dielectric loss tangent has not hitherto been known.

SUMMARY OF THE INVENTION

If it were possible to freely adjust the dielectric properties, particularly the dielectric loss tangent, of existing silica powders and quartz glass cloth, their use could be expanded to a broad range of applications as sealants in semiconductors for high-speed communications and as reinforcements and fillers in substrates for high-speed communications or in antenna substrates, all of which are expected to see major growth in the future. It is therefore an object of the present invention to provide a fluoroplastic substrate for high-speed communications which has a dielectric loss tangent at 40 GHz of from 0.0001 to 0.0008 and a permittivity at 40 GHz of from 2.0 to 3.2. The resin substrate is a fluoroplastic substrate which has a dielectric loss tangent that is uniform on a microscopic level and has little frequency dependence, and which has no difference in the propagation time and is able to send good signals of stable quality.

We have conducted intensive research in order to resolve the above challenges, carrying out in particular investigations aimed at achieving lower dielectric properties without frequency dependency. As a result, by combining a quartz glass cloth having a dielectric loss tangent at 40 GHz of from 0.0001 to 0.0008 with a fluoroplastic having a dielectric loss tangent at 40 GHz of from 0.0001 to 0.0005, we have arrived at a low-dielectric substrate for high-speed communications that has dielectric properties with very little frequency dependence in the 20 to 100 GHz frequency band and exhibits remarkably little transmission loss, future demand for which can be expected to grow significantly.

In addition, we have found that by freely varying the heat treatment conditions, the dielectric loss tangents of quartz glass cloth and silica powder can be brought into line with that of fluoroplastics other than Teflon®, and have thereby arrived at a low-dielectric substrate for high-speed communications which has very little variability in the dielectric loss tangent properties with respect to wavelength.

Accordingly, in a first aspect, the invention provides a fluoroplastic substrate for high-speed communications which includes a quartz glass cloth having a dielectric loss tangent at 40 GHz of from 0.0001 to 0.0008 and a fluoroplastic having a dielectric loss tangent at 40 GHz of from 0.0001 to 0.0005, wherein the substrate has a dielectric loss tangent at 40 GHz of from 0.0001 to 0.0008 and a permittivity at 40 GHz of from 2.0 to 3.2.

In a preferred embodiment of the fluoroplastic substrate according to the first aspect of the invention, the substrate further includes silica powder.

In another preferred embodiment of the inventive fluoroplastic substrate, the silica powder has a mean particle size of from 0.1 to 30 μm, a $SiO_2$ content of at least 99.5 wt %, and a dielectric loss tangent at 40 GHz of from 0.0001 to 0.0008.

In yet another preferred embodiment, the quartz glass cloth is a synthetic quartz glass cloth.

In still another preferred embodiment, the fluoroplastic is a tetrafluoroethylene derivative.

In a further preferred embodiment, the quartz glass cloth is a silane coupling agent-treated quartz glass cloth.

In a second aspect, the invention provides a copper-clad fluoroplastic substrate for high-speed communications that includes the fluoroplastic substrate for high-speed communications according to the first aspect of the invention and a copper foil having a surface roughness of 1.5 μm or less, which substrate and foil are bonded together by an intervening resin selected from the group consisting of bismaleimide resins and fluoroplastics having a lower softening point than tetrafluoroethylene derivatives.

In a preferred embodiment of the copper-clad fluoroplastic substrate according to the second aspect of the invention, the resin is a tetrafluoroethylene/perfluoroalkoxyethylene copolymer (PFA).

In another preferred embodiment of the copper-clad fluoroplastic, the resin is a bismaleimide resin of the general formula

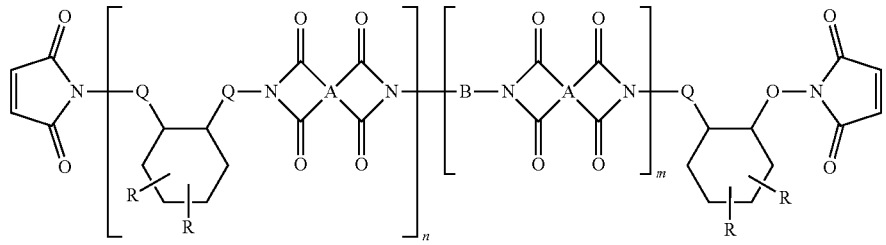

wherein each A is independently a tetravalent organic group that includes an aromatic ring or an aliphatic ring, B is a divalent alkylene chain of 6 to 18 carbon atoms which may include a heteroatom and has an aliphatic ring, each Q is independently a linear alkylene group of 6 or more carbon atoms, each R is independently a linear or branched alkyl group of 6 or more carbon atoms, n is a number from 1 to 10, and m is a number from 0 to 10.

Advantageous Effects of the Invention

This invention makes it possible to provide an ideal substrate which has dielectric properties with very little frequency dependence in the frequency band of 20 to 100

GHz and exhibits very little transmission loss in high-speed communications at extremely high frequencies.

DETAILED DESCRIPTION OF THE INVENTION

Figure 1:
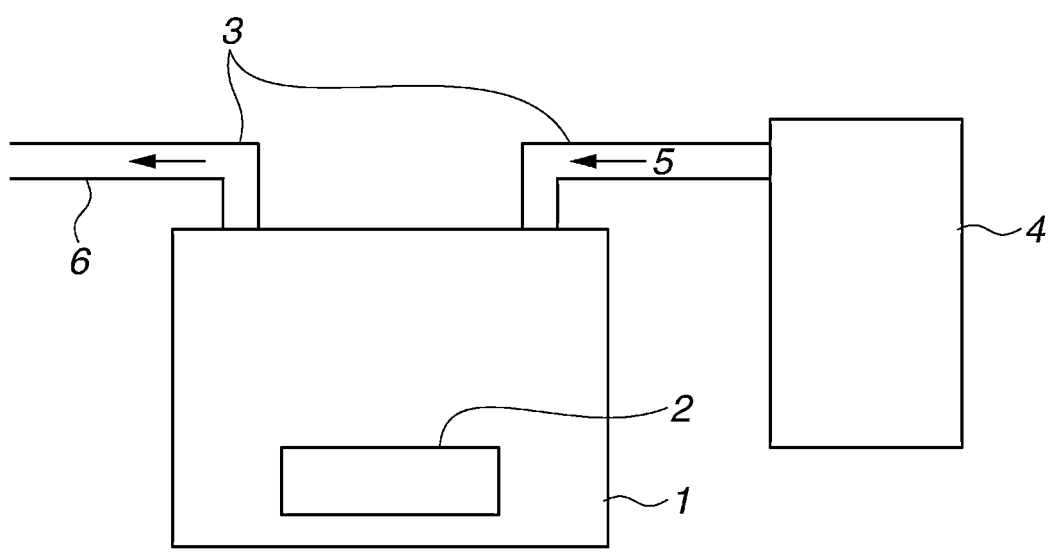
FIG. 1 is a diagram showing an example of an apparatus for feeding a dry gas such as may be used in working the invention.

The objects, features and advantages of the invention will become more apparent from the following detailed description taken in conjunction with the appended diagram.

Quartz Glass Cloth

The quartz glass cloth of the invention is a quartz glass cloth having a dielectric loss tangent at 40 GHz of from 0.0001 to 0.0008. Naturally produced quartz containing few impurities or synthetic quartz obtained from silicon tetrachloride or the like as the feedstock may be chiefly used as the material making up the quartz glass cloth used in this invention.

The $SiO_2$ content, although not particularly limited, is typically selected from the range of 90 to 100 wt %, but is preferably at least 95 wt %, and more preferably at least 99.9 wt %. The concentrations of impurities in the quartz glass material are preferably not more than 10 ppm for the alkali metals sodium, potassium and lithium combined, not more than 1 ppm for boron, not more than 1 ppm for phosphorus and, in order to prevent malfunctions due to radiation, not more than 0.1 ppb for uranium and thorium.

The quartz glass cloth of the invention can be fabricated by weaving filament or yarn produced from a quartz glass ingot as the starting material. The quartz glass ingot can be produced by an electric melting process or a flame fusion process using naturally produced quartz as the feedstock. Alternatively, a synthetic quartz glass ingot can be produced by direct synthesis using silicon tetrachloride as the starting material, plasma synthesis or the soot process; or by a sol-gel process using an alkyl silicate as the raw material. For example, the 100 to 300 μm diameter quartz glass thread used in this invention can be produced by melting an ingot at between 1,700 and 2,300° C., and drawing and taking up the material.

In this Specification, the slender continuous single fibers obtained by stretching the above quartz glass thread are referred to as "quartz glass filaments," a group of quartz glass filaments that have been gathered into a bundle is referred to as a "quartz glass strand," and a group of quartz glass filaments that have been gathered into a bundle and twisted is referred to as a "quartz glass yarn."

The diameter of a quartz glass filament is preferably from 3 to 20 μm, and more preferably from 3.5 to 9 μm. Methods for producing quartz glass filament include, for example, a drawing process that involves electrically melting the above quartz glass thread or the use of an oxyhydrogen flame. However, the production method used is not limited to these, so long as the quartz glass filament has a diameter of from 3 to 20 μm.

From 10 to 400, preferably from 40 to 200, quartz glass filaments are gathered into a bundle to produce a quartz glass strand. The quartz glass cloth used in this invention can be woven from the above quartz glass yarn or strand. The method used to weave glass cloth is not particularly limited and may involve the use of, for example, a rapier loom, a shuttle loom, or an air jet loom.

A low-dielectric quartz glass cloth having a dielectric loss tangent in the high-frequency region, i.e., at 40 GHz, of from 0.0001 to 0.0008 is used in this invention. The dielectric loss tangent of the quartz glass cloth at 40 GHz is preferably from 0.0001 to 0.0006, and more preferably from 0.0001 to 0.0005. The quartz glass cloth has a permittivity at 40 GHz which is preferably from 3.2 to 4.0. The methods used to measure the dielectric loss tangent and the permittivity are based on the resonance method, which is described in detail in the Examples section below.

The method for producing such low-dielectric quartz glass cloth is not particularly limited, so long as the intended product can be obtained. For example, the low-dielectric quartz glass cloth can be obtained by a method that includes the step of placing a quartz glass cloth in a heating furnace and heating the cloth under a vacuum or within a gas having a dew point of 15° C. or below and under conditions where the maximum heating temperature is between 100° C. and 600° C. and the heating amount, expressed as the heating temperature of 100° C. or more multiplied by the heating time in hours (h), is at least 450 (° C.·h). An example of this method is described in detail below. In addition, the surface of the quartz glass may be treated with a coupling agent or the like.

Heating Furnace:

The heating furnace used for heating is one which can heat at between 100° C. and 600° C. and the interior of which can be placed under a vacuum or in an atmosphere of a dry gas having a dew point of 15° C. or less. Any such heating furnace may be used without particular limitation. The heating furnace may be, for example, a gas furnace, an electric furnace, a muffle furnace or a laser-heating furnace.

Of these, it is preferable to use a heating furnace having a heat-generating mechanism such that the amount of water which forms per unit heat value (1,000 kcal) is 0.12 L or less. No particular limitation is imposed on the heating furnace, so long as it has such a heat-generating mechanism. Examples include heating furnaces having a heat-generating mechanism capable of the above, such as an electric furnace, a muffle furnace or a laser-heating furnace. Electric furnaces in particular, because they operate without combustion, enable the amount of water in the gas to be set to 0.12 or less, and even below 0.10 L.

The heating furnace preferably has an apparatus for feeding a dry gas into the furnace interior. The arrangement typically includes a heating furnace 1, quartz glass cloth or silica powder 2 that is held in a container made of alumina or the like and placed in the heating furnace 1, a mechanism 4 such as a compressor or air dryer which produces a dry gas, a pipeline 3 which connects the dry gas-producing mechanism 4 with the furnace interior and fills or feeds the dry gas into the furnace 1, and a mechanism 6 which exhausts gases from the furnace interior. FIG. 1 shows an example of the apparatus for feeding dry gas into the heating furnace. However, the present invention is not limited to this feeding method.

Heating Atmosphere:

When the quartz glass cloth is heated in a vacuum or in a gas having a dew point of 15° C. or below, the gas is preferably air or an inert gas such as nitrogen or argon.

When the furnace interior is placed under a vacuum, a vacuum and pressurized sintering furnace such as VESTA from Shimadzu Corporation may be used.

The method for placing the furnace interior under a gas having a dew point of 15° C. or below is not particularly limited and may involve, for example, filling the furnace interior with dry gas having a dew point of 15° C. or below prior to heating or feeding dry gas having a dew point of 15° C. or below into the furnace. Such feeding may take place before heating, during temperature ramp-up, during temperature hold or during temperature ramp-down, or feeding may be carried out in a plurality of stages selected from among these. Of these, it is preferable to feed a dry gas having a dew point of 15° C. or below, especially 0° C. or below, to the furnace interior, and it is preferable to do so during temperature ramp-down. Examples of the dry gas include dry gases having a dew point of 15° C. or below that are selected from among air and inert gases such as nitrogen and argon. Of these, from the standpoint of production efficiency, dry air is preferred. The apparatus for producing such dry air may be, for example, a compressor or an air dryer. The dew point in this invention refers to the dew point at atmospheric pressure. The dew point of the dry gas that is filled or fed into the furnace is preferably 15° C. or below (moisture content, 12.8 g/m$^3$), more preferably 0° C. or below (moisture content, 4.85 g/m$^3$), even more preferably −20° C. or below (moisture content, 1.07 g/m$^3$), and still more preferably −60° C. or below (moisture content, 0.0193 g/m$^3$). In the step of heating within a gas, the equilibrium of the reaction $SiO_2+H_2O \Leftrightarrow Si-OH$ shifts to the left as the dew point of the gas becomes lower, lowering the dielectric loss tangent of the quartz glass cloth.

Dry gas that is filled or fed into the furnace prior to heating may be set to a dew point of 15° C. or below, although a dew point of 0° C. or below is preferred. From the standpoints of production efficiency and economy, dry air having a dew point of −20° C. or below is even more preferred.

The dew point of the dry gas fed into the heating furnace may be set to 15° C. or less. To further lower the dielectric loss tangent of the quartz glass cloth, the dew point of the dry gas during the heating step from temperature ramp-up to temperature ramp-down is preferably 0° C. or below, more preferably −20° C. or below, and even more preferably −60° C. or below.

The amount of dry gas fed into the furnace is not particularly limited, although an amount of from 0.5 to 20 times the furnace volume per hour is preferred as a range that sufficiently lowers the dew point within the furnace and keeps the temperature within the furnace constant.

Heating Temperature:

The $SiO_2+H_2O \Leftrightarrow Si-OH$ reaction is activated at 100° C. and above; as the temperature becomes higher, the equilibrium shifts to the left and the Si—OH groups reunite, forming Si—O—Si bonds. That is, at a lower dew point and a higher heating temperature, the number of Si—OH groups decreases and the dielectric loss tangent of the quartz glass cloth becomes smaller. Hence, the maximum heating temperature of the quartz glass cloth may be set to between 100° C. and 600° C., preferably between 300° C. and 550° C., and more preferably between 350° C. and 450° C. At below 100° C., as noted above, the activation energy in the reaction between Si—OH groups is inadequate and so the amount of Si—OH group does not decrease and the dielectric loss tangent does not become smaller. Also, if the quartz glass cloth still has sizing adhering thereto, because there is insufficient energy to burn off the sizing, some of the sizing will end up remaining on the cloth even when the heating time is extended. As a result, the dielectric loss tangent worsens and, due to the residual sizing, defects end up arising in the silane coupling treatment carried out as a subsequent step. For reasons having to do with the flexibility of the quartz glass cloth and the ease of prepreg production, the maximum heating temperature is preferably not more than 600° C.

Figure 2:
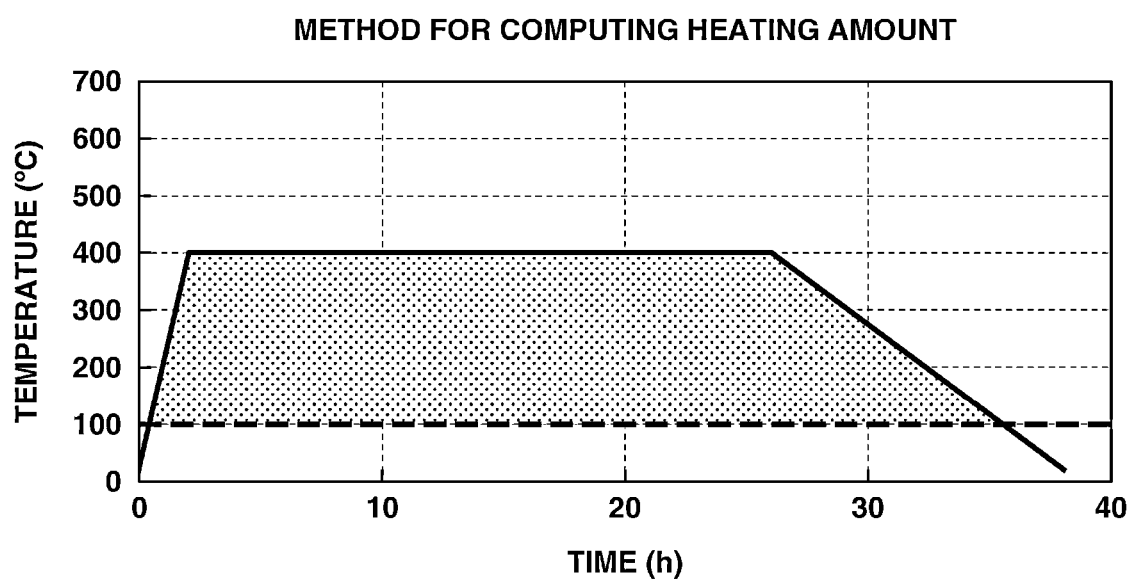
FIG. 2 is a graph showing a method for computing the heating amount in the invention.

Heating Amount:

The heating amount, which is expressed as the temperature (° C.) between 100° C. and 600° C. in a vacuum or a gas having a dew point of 15° C. or less multiplied by the heating time (h), may be set to 450 (° C.·h) or more. When the quartz glass cloth is not in a vacuum or in a gas having a dew point of 15° C. or less, the range below 100° C. is not included in the heating amount. FIG. 2 shows a method for computing this heating amount. The shaded region is the heating amount. This is not affected during temperature ramp-up, temperature hold and temperature ramp-down. The heating amount is not particularly limited, provided that it is 450 (° C.·h) or more, although from the standpoint of production efficiency, it is preferably from 450 to 50,000 (° C.·h), more preferably from 3,000 to 50,000 (° C.·h), and even more preferably from 4,000 to 45,000 (° C.·h).

During temperature ramp-up, temperature hold and temperature ramp-down, heating may be divided into a plurality of steps. During temperature hold, the temperature may be held at a plurality of temperatures. Also, so long as the above heating amount is satisfied, there is no need for a holding time. Although no particular limitation is imposed on the temperature ramp-up and temperature ramp-down rates, they are preferably at least 10 (° C./h) from the standpoint of productivity and preferably less than 200 (° C./h) from the standpoint of the strength of the glass cloth.

In particular, an atmosphere between 100° C. and 300° C., even though it exceeds the activation energy, is a low-temperature region and thus tends to shift the equilibrium of the $SiO_2+H_2O \Leftrightarrow Si-OH$ reaction to the right, where the Si—O—Si bonds most readily cleave. With regard to the timing of dry gas feeding, this may be timed to take place during temperature ramp-up, temperature ramp-down or temperature hold. In order to continue to keep the dew point within the furnace low, it is preferable to continue feeding dry gas into the furnace during all heating from 100 to 600° C., including during temperature ramp-up, temperature hold and temperature ramp-down. In particular, feeding dry gas into the furnace when ramping the temperature down to 100° C. from the maximum heating temperature is effective for improving the dielectric loss tangent. A fluoroplastic substrate for high-speed communications having uniform dielectric properties can be obtained by using the quartz glass cloth produced in this way.

Silica Powder

The fluoroplastic substrate for high-speed communications of the invention may additionally include silica powder. The dielectric loss tangent of the silica powder at 40 GHz is preferably from 0.0001 to 0.0008, and more preferably from 0.0001 to 0.0005. The permittivity of the silica powder at 40 GHz is preferably from 3.2 to 4.0. Silica powder having a mean particle size of from 0.1 to 30 μm and a $SiO_2$ content of 99.5 wt % or more is preferred. Using silica powder in combination with quartz glass cloth is more suitable for substrates such as high-speed communications substrates and antenna substrates. The methods for measuring the dielectric loss tangent and the permittivity are based on the resonance method and are described in detail in the Examples section below.

The silica powder has a mean particle size of preferably from 0.1 to 30 μm, and more preferably from 0.5 to 20 μm. The maximum particle size is preferably 100 μm or less, and more preferably 50 μm or less. To improve properties such as flowability and processability, silica powders of differing mean particle sizes may be blended together. At a mean particle size smaller than 0.1 μm, the specific surface area is large and higher loadings in the resin cannot be achieved; at more than 30 μm, the particles do not pack well into narrow places, resulting in undesirable effects such as incomplete loading. For use as a filler in a substrate for high-speed communications in particular, silica powder having a mean particle size of from 0.1 to 5 μm and a maximum particle size of not more than 20 μm is preferred, and silica powder having a mean particle size of from 0.1 to 3 μm and a maximum particle size of not more than 10 μm is more preferred. In this invention, the maximum particle size and mean particle size can be measured with a laser diffraction type particle size analyzer (e.g., SALD-3100, from Shimadzu Corporation). The mean particle size can be determined as the weight-average value D50 (i.e., the particle diameter or median diameter at 50% cumulative weight) in particle size distribution measurements by the laser diffraction method.

The silica powder is preferably one that additionally has the following properties. The hydroxyl group (Si—OH) content of the silica powder is preferably not more than 300 ppm, more preferably not more than 280 ppm, and even more preferably not more than 150 ppm. The method of measuring the hydroxyl group (Si—OH) content is based on the description given in the Examples section below. Such a silica powder is suitable as a sealant for semiconductors and as a filler for substrates such as high-speed communications substrates and antenna substrates.

The contents of aluminum, magnesium, titanium and oxides thereof at the interior and surface of the silica powder, expressed as the respective weights of aluminum metal, magnesium metal and titanium metal, are preferably not more than 300 ppm each, more preferably not more than 150 ppm, and even more preferably not more than 100 ppm.

The alkali metal and alkaline earth metal contents at the interior and surface of the silica powder, expressed in terms of the weights of the respective metals, are preferably not more than 10 ppm, more preferably not more than 8 ppm, and even more preferably not more than 5 ppm. In this invention, "alkali metal" refers to the elements belonging to Group 1 of the Periodic Table other than hydrogen; namely, lithium, sodium, potassium, rubidium, cesium and francium. "Alkaline earth metal" refers to the elements belonging to Group 2 of the Periodic Table other than beryllium and magnesium; namely, calcium, strontium, barium and radium. A silica powder containing much alkali metal or alkaline earth metal may corrode the electrodes of high-speed communications substrates and semiconductor devices. Hence, to prevent corrosion, a silica powder containing little of these metals is desired.

The boron content at the interior and surface of the low-dielectric loss tangent silica powder is preferably not more than 2 ppm, and more preferably not more than 1 ppm. The phosphorus content is preferably not more than 2 ppm, and more preferably not more than 1 ppm. The uranium and thorium contents are each preferably not more than 0.1 ppb, and more preferably not more than 0.05 ppb. By thus keeping the concentrations of impurities low, a silica powder having more preferable dielectric properties can be obtained.

The amount of aluminum, magnesium, titanium and their oxides, alkali metals and alkaline earth metals, boron, phosphorus, uranium and thorium may be adjusted by suitably selecting the starting silica powder. The concentrations can be measured by, for example, atomic absorptiometry or induction-coupled plasma (ICP) emission spectrochemical analysis.

The method for producing the silica powder is not particularly limited, so long as the intended product can be obtained. For example, the production method may be one that includes the steps of placing silica powder having a mean particle size of from 0.1 to 30 μm in a heating furnace, and heating the powder under a vacuum or within a gas having a dew point of 15° C. or below and under conditions where the maximum heating temperature is between 100° C. and 1,000° C. and the heating amount, expressed as the heating temperature of 100° C. or more multiplied by the heating time in hours (h), is at least 450 (° C.·h). In addition, the surface of the silica powder may be treated with a coupling agent or the like. Aside from changing "quartz glass cloth" to "silica powder," the apparatus, operations, preferred ranges and the like that are used may be the same as in the above-described method for producing quartz glass cloth. Also, the maximum heating temperature may be suitably selected from the range of 100° C. to 1,000° C., with 300° C. to 600° C. being preferred, and 350° C. to 450° C. being more preferred. The heating amount may be suitably selected from values of 450 (° C.·h) and above. From the standpoint of production efficiency, the heating amount is preferably from 450 to 50,000 (° C.·h), more preferably from 3,000 to 50,000 (° C.·h), and even more preferably from 4,000 to 50,000 (° C.·h).

The amount of silica powder used with respect to the fluoroplastic is from 0 to 500 parts by weight per 100 parts by weight of the sum of the resin ingredients. When compounding these ingredients, the amount of silica powder is preferably from 20 to 300 parts by weight, and more preferably from 50 to 200 parts by weight. By compounding at least 20 parts by weight, adjustment of the dielectric properties is easier and the coefficient of thermal expansion (CTE) of the cured product can be held down. However, depending on the type of organic resin used and the intended application, silica powder is sometimes not added. From the standpoint of flexibility and appearance at the time of prepreg production, the amount of silica powder used is preferably 500 parts by weight.

Silane Coupling Agent

The fluoroplastic substrate for high-speed communications of the invention may also include a silane coupling agent, or the quartz glass cloth and silica powder described above may be treated beforehand with a silane coupling agent.

A known silane coupling agent may be used for this purpose. One such agent may be used alone or two or more may be used in combination. Of these, alkoxysilanes are preferred. Examples of typical silane coupling agents include amino group-containing silane coupling agents such as 3-aminopropyltrimethoxysilane (available under the trade name KBM-903 from Shin-Etsu Chemical Co., Ltd.), 3-aminopropyltriethoxysilane (available under the trade name KBE-903 from Shin-Etsu Chemical Co., Ltd.), N-2-(aminoethyl)-3-aminopropyltrimethoxysilane (available under the trade name KBM-603 from Shin-Etsu Chemical Co., Ltd.) and N-2-(aminoethyl)-3-aminopropyltriethoxysilane (available under the trade name KBE-603 from Shin-Etsu Chemical Co., Ltd.); unsaturated group-containing silane coupling agents such as vinyltrimethoxysilane (available under the trade name KBM-1003 from Shin-Etsu Chemical Co., Ltd.), vinyltriethoxysilane (available under the trade name KBE-1003 from Shin-Etsu Chemical Co., Ltd.), 3-methacryloxypropyltrimethoxysilane (available under the trade name KBM-503 from Shin-Etsu Chemical Co., Ltd.), 3-methacryloxypropyltriethoxysilane (available under the trade name KBE-503 from Shin-Etsu Chemical Co., Ltd.) and p-styryltrimethoxysilane (available under the trade name KBM-1403 from Shin-Etsu Chemical Co., Ltd.); fluorine atom-containing silane coupling agents such as trifluoropropyltrimethoxysilane (available under the trade name KBM-7103 from Shin-Etsu Chemical Co., Ltd.) and perfluoropolyether-containing trialkoxysilanes (available under the trade names X-71-195, KY-1901 and KY-108 from Shin-Etsu Chemical Co., Ltd.); glycidoxypropyltrimethoxysilane (available under the trade name KBM-403 from Shin-Etsu Chemical Co., Ltd.), glycidoxypropyltriethoxysilane (available under the trade name KBE-403 from Shin-Etsu Chemical Co., Ltd.), 3-mercaptopropyltrimethoxysilane (available under the trade name KBM-803 from Shin-Etsu Chemical Co., Ltd.), 3-isocyanotopropyltriethoxysilane (available under the trade name KBE-9007 from Shin-Etsu Chemical Co., Ltd.) and 3-trimethoxysilylpropylsuccinic anhydride (available under the trade name X-12-967C from Shin-Etsu Chemical Co., Ltd.). Additional examples include oligomers of the above amino group-containing silane coupling agents and unsaturated group-containing silane coupling agents. Of the above, amino group-containing silane coupling agents and unsaturated group-containing silane coupling agents are more preferred.

The silane coupling agent is used as a dilute aqueous solution having a concentration of generally from 0.05 to 5 wt %, although a concentration in the range of 0.1 to 1 wt % is especially effective. The silane coupling agent uniformly adheres to the quartz glass cloth employed in the invention and not only confers a more uniform protective effect to the glass cloth and the surface of the silica powder, which makes handling easier, but also enables uniform and even application of the resin used when producing a prepreg. In cases where the quartz glass cloth is treated beforehand with the silane coupling agent, the quartz glass cloth to be silane-treated is simply immersed in the above aqueous solution. The temperature and time are suitably selected within ranges of, for example, from 50° C. to 200° C. and from 30 seconds to one hour. The amount of silane coupling agent with respect to the quartz glass cloth is preferably from 0.05 to 1 wt %. In cases where the silica powder is treated beforehand with the silane coupling agent, the silica powder to be silane-treated is subjected to wet treatment in which it is immersed in the above aqueous solution or to dry treatment using a Henschel mixer, a rocking mixer or the like. The amount of silane coupling agent used with respect to the silica powder is preferably from 0.05 to 3 wt %.

Fluoroplastic

The fluoroplastic of the invention has a dielectric loss tangent at 40 GHz of from to 0.0005. The fluoroplastic is exemplified by tetrafluoroethylene derivatives, and is preferably one or more selected from the group consisting of polytetrafluoroethylene (PTFE), tetrafluoroethylene-ethylene copolymers (ETFE), tetrafluoroethylene-hexafluoropropylene copolymers (FEP), tetrafluoroethylene-perfluoroalkoxyethylene copolymers (PFA), polychlorotrifluoroethylene (PCTFE), chlorotrifluoroethylene-ethylene copolymers (ECTFE), chlorotrifluoroethylene-tetrafluoroethylene copolymers and polyvinylidene fluoride (PVdF), and also thermoplastic fluoroplastics (THV) composed of three types of monomers: tetrafluoroethylene, hexafluoropropylene and vinylidene fluoride. Of these, polytetrafluoroethylene (PTFE), tetrafluoroethylene-hexafluoropropylene copolymers (FEP) and tetrafluoroethylene-perfluoroalkoxyethylene copolymers (PFA) are preferred from the standpoint of the dielectric loss tangent. Polytetrafluoroethylene (PTFE) has excellent dielectric properties and is thus more preferred. Also, tetrafluoroethylene-perfluoroalkoxyethylene copolymers (PFA) are preferred because they enhance the adhesive properties of fluoroplastics, which have inferior adhesion. A system that combines polytetrafluoroethylene (PTFE) with a low-dielectric loss tangent silica powder is preferred from the standpoint of the dielectric properties. The dielectric loss tangent may be measured by various methods. Details are provided in the Examples section below.

It is possible to add a thermosetting resin or thermoplastic resin and to laminate resin films so long as doing so does not worsen the above dielectric properties. Examples of thermosetting resins include epoxy resins, allylated epoxy resins, maleimide resins, bismaleimide resins, cyanate resins and cyclopentadiene-styrene copolymer resins. Of these, bismaleimide resins of the following general formula are used as organic resins suitable for lowering the dielectric properties.

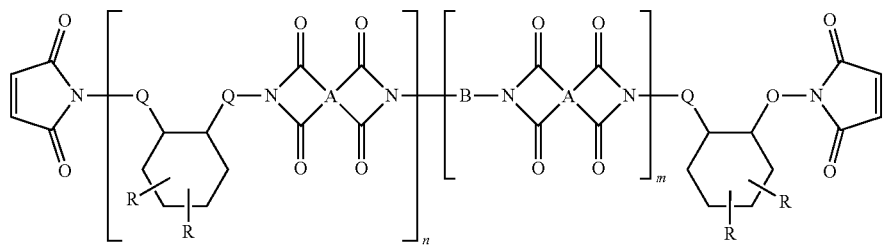

In the formula, each A is independently a tetravalent organic group that includes an aromatic ring or an aliphatic ring, B is a divalent alkylene chain of 6 to 18 carbon atoms which has an aliphatic ring and may include a heteroatom, each Q is independently a linear alkylene group of 6 or more carbon atoms, each R is independently a linear or branched alkyl group of 6 or more carbon atoms, n is a number from 1 to 10, and m is a number from 0 to 10. Typical bismaleimide resins include the SLK Series (from Shin-Etsu Chemical Co., Ltd., such as SLK-6895, SLK-3000 and SLK-2600). Heat-curable cyclopentadiene-styrene copolymer resins may also be used as highly heat-resistant, low-dielectric resins. Typical examples include the SLK-250 Series (Shin-Etsu Chemical Co., Ltd.). The structural formula of SLK-3000 is shown below by way of illustration.

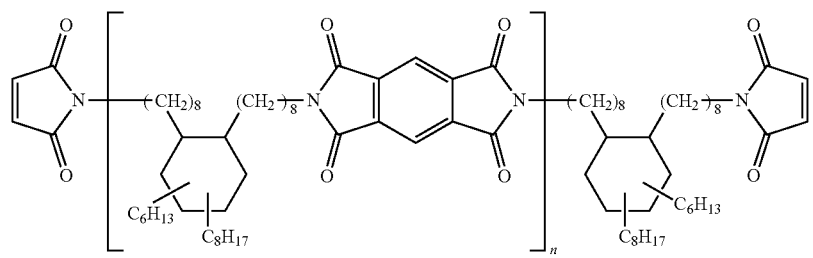

In this formula, n≈3 (average value).

Generally, when a resin having low dielectric properties such as a fluoroplastic is used as the matrix resin in a substrate, because conventional low-dielectric glass cloth has a larger dielectric loss tangent than the fluoroplastic, the dielectric property difference with glass cloth in which only resin has been filled into the basket holes becomes large. For this reason, a method that homogenizes the dielectric properties by filling silica powder into the basket holes is employed. Yet, although the dielectric properties are indeed homogenized by this technique, in spite of the use of a low-dielectric fluoroplastic, the dielectric properties of the resin substrate worsen on account of the dielectric properties of the glass cloth and the silica powder. In this invention, by using quartz glass cloth having a dielectric loss tangent at 40 GHz of from 0.0001 to 0.0008 and, optionally, silica powder having a dielectric loss tangent at 40 GHz of from 0.0001 to 0.0005, a fluoroplastic substrate for high-speed communications that has homogeneous dielectric properties can be produced.

Fluoroplastic Substrate for High-Speed Communications

In the fluoroplastic substrate for high-speed communications of the invention, "high-speed communications" refers to high-speed communications that use EHF or higher frequencies. By virtue of this invention, fluoroplastic substrates which incur very little transmission loss even in such high-speed communications can be obtained.

The construction of the fluoroplastic substrate for high-speed communications is exemplified by resin substrates obtained by impregnating quartz glass cloth with a fluoroplastic to form a prepreg which is then subjected to applied heat and pressure, resin substrates obtained by forming a composite of a quartz glass cloth and a fluoroplastic, and resin substrates obtained by impregnating quartz glass cloth with a silica powder-containing fluoroplastic to form a prepreg which is then subjected to applied heat and pressure.

The fluoroplastic substrate for high-speed communications of the invention has a dielectric loss tangent at 40 GHz of from 0.0001 to 0.0008 and a permittivity at 40 GHz of from 2.0 to 3.2. The dielectric loss tangent at 40 GHz is preferably from 0.0001 to 0.0006, more preferably from 0.0001 to 0.0005, and even more preferably from 0.0001 to 0.0004. The permittivity at 40 GHz is suitably selected according to the constituent ratios of the quartz glass cloth, fluoroplastic and silica powder making up the substrate, and is preferably from 2.2 to 3.2, more preferably from 2.4 to 3.1, and even more preferably from 2.5 to 3.0.

Method of Manufacturing Fluoroplastic Substrate for High-Speed Communications

In the case of thermoplastic resins which are poorly soluble in solvents, a prepreg can be produced by heat and pressure bonding a thin film of the resin and quartz glass cloth. For example, when producing a fluoroplastic substrate, the method may involve pressure bonding a preformed fluoroplastic film and a glass cloth under applied heat. Pressure bonding under applied heat may be carried out within a range of generally between 250° C. and 400° C. for a period of from 1 to 60 minutes and under a pressure of from 0.1 to 10 MPa. The heat and pressure bonding temperature depends on the softening temperature of the fluoroplastic, but when a high temperature is used, the resin may ooze out or a lack of uniformity in the thickness may arise. The temperature is preferably below 340° C., and more preferably 330° C. or less. Heat and pressure bonding may be carried out in a batchwise manner using a press or may be carried out continuously using a high-temperature laminator. When a press is used, to keep air from being trapped and facilitate penetration of the fluoroplastic to the interior of the glass cloth, the use of a vacuum press is preferred.

In cases where an aqueous solution of the fluoroplastic is used, a quartz glass cloth containing fluoroplastic and silica powder can be obtained by first mixing a given amount of silica powder into the aqueous solution to form a slurry, then impregnating the quartz glass cloth with the slurry and drying the impregnated cloth. The resulting quartz glass cloth is then pressed under the above temperature, time and pressure conditions, producing a prepreg. In a system that is an aqueous solution of a fluoroplastic fine powder, because an organic surfactant or the like is included, it is preferable to remove the surfactant by, for example, heating at between 220° C. and 400° C. for a period of from 1 minute to 1 hour. No particular limitation is imposed on the organic surfactant; any known surfactant of this type may be used in a suitable amount.

In cases where a fluoroplastic substrate is produced using the above fluoroplastic film or an aqueous solution of the fluoroplastic, the amount of fluoroplastic with respect to the quartz glass cloth is not particularly limited. However, from the standpoint of, for example, substrate processability and substrate reliability, it is preferable to adjust the volume fraction of fluoroplastic within the fluoroplastic substrate that has been produced within the range of 20 to 80 vol %. When an aqueous solution of the fluoroplastic is used, the step of impregnating/applying the solution to a quartz glass cloth may be carried out a plurality of times in order to adjust the volume fraction as desired.

Copper-Clad Fluoroplastic Substrate for High-Speed Communications

A copper-clad fluoroplastic substrate for high-speed communications can be obtained by bonding the above-described fluoroplastic substrate for high-speed communications together with copper foil having a surface roughness of 1.5 μm or less using an intervening resin selected from bismaleimide resins and fluoroplastics having a lower softening point than tetrafluoroethylene derivatives.

Because the bond strength between a fluoroplastic and copper foil is generally very weak, production by direct heat and pressure bonding is impossible. In this invention, as a result of studies conducted on resins that have an adequate adhesive strength to copper foil with a surface roughness of 1.5 μm or less, we have discovered that bismaleimide resins and fluoroplastics having a lower softening point than tetrafluoroethylene derivatives are effective for bonding together low-roughness copper foil and fluoroplastics, thereby making it possible to produce copper-clad fluoroplastic substrates for high-speed communications.

No particular limitation is imposed on the copper foil having a surface roughness of 1.5 μm or less, so long as it satisfies these conditions. The surface roughness in this invention is a value measured in accordance with JIS-C-6481: 1996. The thickness of the copper foil is not particularly limited; copper foil having a thickness within a normal range may be used.

The bismaleimide resins and fluoroplastics having a lower softening point than tetrafluoroethylene derivatives that are used to bond together the copper foil and the fluoroplastic substrate for high-speed communications may be of one type used alone or two or more types may be used in combination. Examples of bismaleimide resins include the bismaleimide resins represented by the above formula; preferred examples are also the same as mentioned above.

Examples of fluoroplastics having a lower softening point than tetrafluoroethylene derivatives include tetrafluoroethylene/perfluoroalkoxyethylene copolymers (PFA), ethylene-tetrafluoroethylene copolymers (ETFE) and tetrafluoroethylene/hexafluoropropylene copolymers (FEP).

The bismaleimide resins and fluoroplastics having a lower softening point than tetrafluoroethylene derivatives that are used are preferably ones which have been formed into a film having a thickness of 100 μm or less, preferably 50 μm or less. Because bismaleimide resins are thermosetting, they are formed into a film using as the feedstock a mixture that includes a catalyst such as a peroxide. The copper-clad fluoroplastic substrate for high-speed communications can be easily manufactured by laminating and heat and pressure bonding a fluoroplastic substrate, an adhesive film and copper foil. Heat and pressure bonding under applied heat can be carried out at generally between 250° C. and 400° C. for a period of from 1 to 60 minutes and at a pressure of from 0.1 to 10 MPa. The heat and pressure bonding temperature depends on the softening temperature of the fluoroplastic, but when it is high, oozing of the resin or a lack of uniformity in the thickness may arise. The temperature is preferably below 340° C., and more preferably 330° C. or less. Heat and pressure bonding may be carried out in a batchwise manner using a press or may be carried out continuously using a high-temperature laminator. When using a press, to keep air from being trapped and facilitate penetration of the fluoroplastic into the glass cloth, it is preferable to make use of a vacuum press. The electrode pattern on the metal-clad laminated substrate may be created by a known method. For example, the pattern may be created by etching the copper-clad fluoroplastic substrate for high-speed communications.

EXAMPLES

The invention is illustrated more fully below by way of Examples and Comparative Examples, although the invention is not limited by these Examples.

The following method was used to measure the dielectric loss tangent of the glass cloth.

The dielectric loss tangents of the glass cloth at 10 GHz and 40 GHz were measured using a cavity resonator (TEO11 mode) from AET, Inc. The thickness of the glass cloth was measured using the theoretical film thickness, which was computed as follows:

theoretical film thickness $t$ (μm)=basis weight $(g/m^2)$/specific gravity $(g/cm^3)$ The following method was used to measure the dielectric loss tangent of the silica powder.

Silica powder was mixed with and dispersed and dissolved in an anisole solution containing the low-dielectric maleimide resin SLK-3000 (Shin-Etsu Chemical Co., Ltd.) and, as a curing agent, the radical polymerization initiator dicumyl peroxide (Percumyl D, from NOF Corporation) in the proportions shown in Table 1 below, thereby preparing a varnish.

Silica powder was added in the proportions shown in Table 1 below such that the volume percent relative to the combined amount of silica powder and resin (SLK-3000) becomes 0%, 17.6%, 33.3% or 48.1%, and the mixture was spread out to a thickness of 200 mm with a bar coater and placed in a dryer for 30 minutes at 80° C. so as to remove the anisole solvent, thereby preparing an uncured maleimide resin composition.

TABLE 1

| Composition | Vol % of silica powder w/r total amount of silica powder and resin | | | |
|---|---|---|---|---|
| | 0 | 17.6 | 33.3 | 48.1 |
| Silica powder (pbw) | 0 | 30 | 50 | 65 |
| SLK-3000 (pbw) | 100 | 70 | 50 | 35 |
| Dicumyl peroxide (pbw) | 2.0 | 1.4 | 1.0 | 0.7 |
| Anisole (pbw) | 60 | 42 | 30 | 21 |

The uncured maleimide resin composition thus prepared was placed in a 60 mm×60 mm×100 μm frame and cured for 10 minutes at 180° C. and 30 MPa with a hand press, following which it was completely cured for one hour in a dryer at 180° C., thereby producing a cured resin sheet. The cured resin sheet was cut to a size of 50 mm×50 mm, and the dielectric loss tangent at 10 GHz was measured using a split post dielectric resonator (SPDR) for dielectric measurements (Keysight Technologies, Inc.) at a dielectric resonator frequency of 10 GHz.

Figure 3:
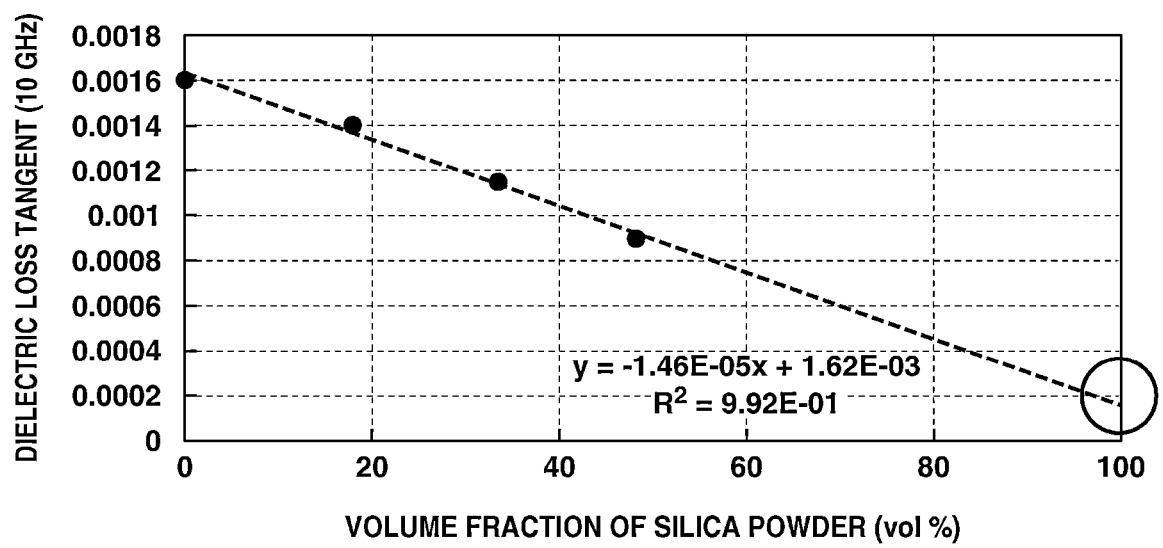
FIG. 3 is a diagram illustrating a method for calculating the dielectric loss tangent of silica powder.

As shown in FIG. 3, the resulting dielectric loss tangent values were plotted as a graph of the volume percent of silica powder on the horizontal axis versus the dielectric loss tangent on the vertical axis. The straight line obtained was extrapolated out to 100 vol % silica powder and the dielectric loss tangent at this point was treated as the dielectric loss tangent of silica powder.

Although there are also instruments capable of directly measuring silica powders, because the silica powder is filled into a measurement pot and measured, it is difficult to remove entrained air. In silica powder in particular, with its large specific surface area, the influence of entrained air is large, making this problem all the more acute. Hence, in order to eliminate the influence of entrained air and obtain a value for a state that is close to the actual manner of use, the dielectric loss tangent of silica powder was determined in this invention based on the above-described method of measurement. The dielectric loss tangents at 40 GHz in the Examples and Comparative Examples were determined by the same procedure and method of calculation as for the measurements at 10 GHz. The methods for measuring the permittivities of quartz glass cloth and silica powder were carried out in general accordance with the above method of measuring the dielectric loss tangent.

The permittivity, dielectric loss tangent and transmission loss of the substrate were measured as follows, Measurement of Permittivity and Dielectric Loss Tangent A network analyzer (E5063A, from Keysight Technologies, Inc.) and a SPDR dielectric resonator (Keysight Technologies, Ltd.) were connected, and the permittivity and dielectric loss tangent were measured.

Measurement of Transmission Loss

Figure 4:
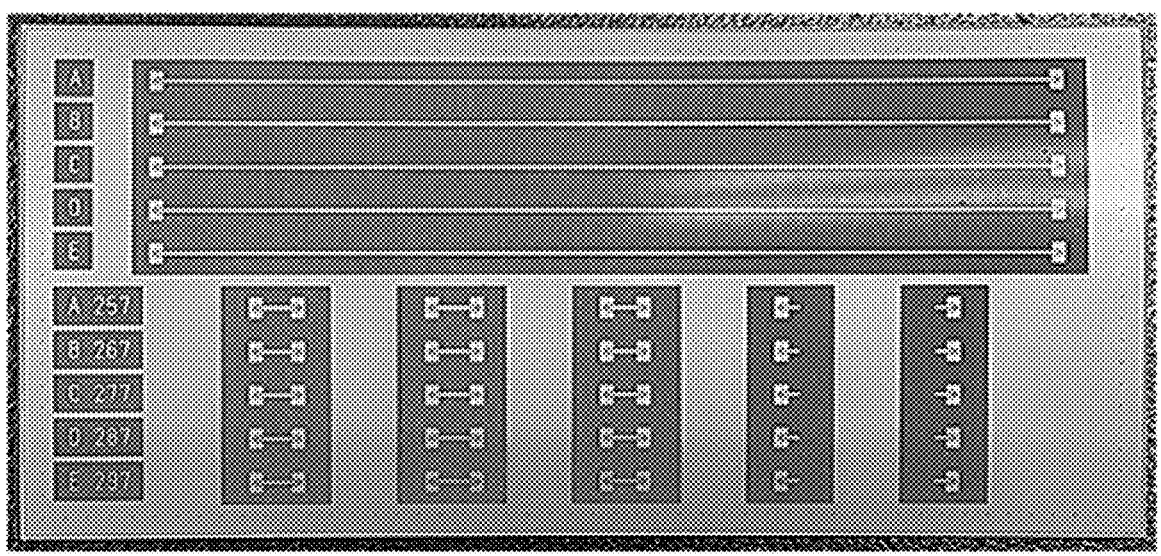
FIG. 4 is a photograph of a circuit board for measuring transmission loss.

Copper-clad substrates produced by bonding, via a bonding film, copper foil having a surface roughness Rz of 0.6 μm and a thickness of 18 μm onto the substrates obtained in the respective Examples and Comparative Examples were subjected to etching treatment, thereby fabricating circuit boards having microstrip lines with a circuit length of 100 mm. The transmission loss was measured using these circuit boards. FIG. 4 shows a circuit board fabricated in this way.

The circuit board was connected to a network analyzer (N5227B, from Keysight Technologies, Inc.) and the transmission loss was measured.

Preparation Example 1: Quartz Glass Cloth (1)

A sizing for quartz glass fibers was applied to quartz glass thread as it was being drawn at high temperature, thereby producing a quartz glass strand consisting of two hundred 5.0 μm-diameter quartz glass filaments. Twist (0.4 turn per 25 mm) was then applied to the quartz glass strand, thereby producing a quartz glass yarn.

The resulting quartz glass yarn was set in an air jet loom, and a plain-weave quartz glass cloth having a warp density of 54 yarns/25 mm and a weft density of 54 yarns/25 mm was woven. The quartz glass cloth (SQ1) had a thickness of 0.045 mm, a cloth weight of 42.5 g/m² and a dielectric loss tangent of 0.0023 (40 GHz).

This quartz glass cloth was heat-treated at 500° C. for 24 hours (temperature rising rate: 100° C./hour, temperature cooling rate: 20° C./hour) using the B80x85x200-3Z12-10 electric furnace from NEMS Co., Ltd., during which 5 times the volume of the electric furnace per hour of −20° C. dew-point dry air produced using the POD-15VNP inverter package oil-free Bebicon air compressor (Hitachi) was delivered to the furnace from temperature ramp-up until ramp-down. The heating amount (° C.·h) is as follows.

During temperature rise to 500° C.

[(500−100)×(500−100)/100]/2=800

During temperature at 500° C. for 24 hours (500−100)×24=9,600

During cooling down to 100° C.

[(500−100)×(500−100)/20]/2=4,000

Total 14,400 (° C.·h)=800+9,600+4,000

Next, the heat-treated quartz glass cloth was surface-treated by 10 minutes of immersion in an aqueous solution of 0.5 wt % KBM-903 (3-aminopropyltrimethoxysilane, available under this trade name from Shin-Etsu Chemical Co., Ltd.) followed by 20 minutes of drying under heating at 110° C. The Quartz Glass Cloth (1) thus obtained had a dielectric loss tangent at 40 GHz of 0.0003.

Preparation Example 2: Quartz Glass Cloth (2)

As in Preparation Example 1, the quartz glass cloth produced in Preparation Example 1 (SQ1) was heat-treated at 500° C. for 24 hours (temperature rising rate: 100° C./hour, temperature cooling rate: 20° C./hour) using the B80x85x200-3Z12-10 electric furnace (NEMS Co., Ltd.), during which 5 times the volume of the electric furnace per hour of −70° C. dew-point dry air produced using the POD-15VNP inverter package oil-free Bebicon air compressor (Hitachi) was delivered to the furnace from temperature ramp-up until ramp-down.

The heat-treated quartz glass cloth was then surface-treated by 10 minutes of immersion in an aqueous solution of 0.5 wt % KBM-903 (3-aminopropyltrimethoxysilane, available under this trade name from Shin-Etsu Chemical Co., Ltd.) followed by 20 minutes of drying under heating at 110° C. The Quartz Glass Cloth (2) thus obtained had a dielectric loss tangent at 40 GHz of 0.0001.

Preparation Example 3: Quartz Glass Cloth (3)

As in Preparation Example 1, the quartz glass cloth produced in Preparation Example 1 (SQ1) was heat-treated at 500° C. for 36 hours (temperature rising rate: 100° C./hour, temperature cooling rate: 20° C./hour) using the B80x85x200-3Z12-10 electric furnace (NEMS Co., Ltd.), during which 5 times the volume of the electric furnace per hour of −20° C. dew-point dry air produced using the POD-15VNP inverter package oil-free Bebicon air compressor (Hitachi) was delivered to the furnace from temperature ramp-up until ramp-up.

Next, the heat-treated quartz glass cloth was surface-treated by 10 minutes of immersion in an aqueous solution of 0.5 wt % KBM-903 (3-aminopropyltrimethoxysilane, available under this trade name from Shin-Etsu Chemical Co., Ltd.) followed by 20 minutes of drying under heating at 110° C. The Quartz Glass Cloth (3) thus obtained had a dielectric loss tangent at 40 GHz of 0.0002.

Preparation Example 4: Quartz Glass Cloth (4)

As in Preparation Example 1, the quartz glass cloth produced in Preparation Example 1 (SQ1) was heat-treated at 800° C. for 16 hours (temperature rising rate: 100° C./hour, temperature cooling rate: 25° C./hour) using the B80x85x200-3Z12-10 electric furnace (NEMS Co., Ltd.), during which 5 times the volume of the electric furnace per hour of −20° C. dew-point dry air produced using the POD-15VNP inverter package oil-free Bebicon air compressor (Hitachi) was delivered to the furnace from temperature ramp-up until ramp-down.

Next, the heat-treated quartz glass cloth was surface-treated by 10 minutes of immersion in an aqueous solution of 0.5 wt % KBM-903 (3-aminopropyltrimethoxysilane, available under this trade name from Shin-Etsu Chemical Co., Ltd.) followed by 20 minutes of drying under heating at 110° C. The Quartz Glass Cloth (4) thus obtained had a dielectric loss tangent at 40 GHz of 0.0001.

Preparation Example 5: Quartz Glass Cloth (5) (Comparative Product)

As in Preparation Example 1, the quartz glass cloth produced in Preparation Example 1 (SQ1) was heat-treated at 500° C. for 24 hours (temperature rising rate: 100° C./hour, temperature cooling rate: 20° C./hour) with 20° C. dew-point air using the B80x85x200-3Z1210-electric furnace (NEMS Co., Ltd.).

Next, the heat-treated quartz glass cloth was surface-treated by 10 minutes of immersion in an aqueous solution of 0.5 wt % KBM-903 (3-aminopropyltrimethoxysilane, available under this trade name from Shin-Etsu Chemical Co., Ltd.) followed by 20 minutes of drying under heating at 110° C. The Quartz Glass Cloth (5) thus obtained had a dielectric loss tangent at 40 GHz of 0.0020.

Preparation Example 6: Low-Dielectric Silica Powder (1)

Silica (SO-E5, from Admatechs) having a mean particle size of 1.5 µm and a dielectric loss tangent at 40 GHz of 0.0015 was heat-treated in the same way as in Preparation Example 1 for 16 hours at 800° C. (temperature rising rate: 100° C./hour, temperature cooling rate: 25° C./hour) in a −20° C. dew-point dry air atmosphere from temperature ramp-up until ramp-down. The resulting low-dielectric silica powder was surface-treated with the silane coupling agent KBM-503 (3-methacryloxypropyltrimethoxysilane, available under this trade name from Shin-Etsu Chemical Co., Ltd.). The Low-Dielectric Silica Powder (1) thus obtained had a dielectric loss tangent at 40 GHz of 0.0003.

Preparation Example 7: Low-Dielectric Silica Powder (2)

Silica (RS8225, from Tatsumori, Ltd.) having a mean particle size of 15 µm and a dielectric loss tangent at 40 GHz of 0.0012 was heat-treated in the same way as in Preparation Example 2 for 16 hours at 800° C. (temperature rising rate: 100° C./hour, temperature cooling rate: 25° C./hour) in a −70° C. dew-point dry air atmosphere from temperature ramp-up until ramp-down. The resulting low-dielectric silica powder was surface-treated with the silane coupling agent KBM-503 (3-methacryloxypropyltrimethoxysilane, available under this trade name from Shin-Etsu Chemical Co., Ltd.). The Low-Dielectric Silica Powder (2) thus obtained had a dielectric loss tangent at 40 GHz of 0.0002. Details on the Preparation Examples are summarized in the following tables.

TABLE 2

| | | Preparation Example | | | | |
|---|---|---|---|---|---|---|
| | | 1 | 2 | 3 | 4 | 5 (Comparative Product) |
| Quartz glass cloth | | SQ1 | SQ1 | SQ1 | SQ1 | SQ1 |
| Heat Treatment | Maximum heating temperature (° C.) | 500 | 500 | 500 | 800 | 500 |
| | Heating time (h) | 24 | 24 | 36 | 16 | 24 |
| | Heating amount (° C. · h) | 14,400 | 14,400 | 19,200 | 23,450 | 0 |
| Dry air dew point (° C.) | | −20 | −70 | −20 | −20 | 20 |
| Quartz glass cloth No. | | (1) | (2) | (3) | (4) | (5) |
| Dielectric loss tangent (40 GHz) | Before heat treatment | 0.0023 | 0.0023 | 0.0023 | 0.0023 | 0.0023 |
| | After heat treatment | 0.0003 | 0.0001 | 0.0002 | 0.0001 | 0.0020 |
| Permittivity (40 GHz) | | 3.3 | 3.3 | 3.3 | 3.3 | 3.3 |

TABLE 3

| | | Preparation Example | |
|---|---|---|---|
| | | 6 | 7 |
| Silica powder | | SO-E5 | RS8225 |
| Heat treatment | Maximum heating temperature (° C.) | 800 | 800 |
| | Heating time (h) | 16 | 16 |
| | Heating amount (° C. · h) | 23,450 | 23,450 |

TABLE 3-continued

| | | Preparation Example | |
|---|---|---|---|
| | | 6 | 7 |
| Dry air dew point (° C.) | | −20 | −70 |
| Low-dielectric silica powder No. | | (1) | (2) |
| Dielectric loss tangent (40 GHz) | Before heat treatment | 0.0015 | 0.0012 |
| | After heat treatment | 0.0003 | 0.0002 |
| Permittivity (40 GHz) | | 3.4 | 3.4 |

Example 1

An aqueous dispersion of polytetrafluoroethylene fine particles (aqueous PTFE dispersion) composed of 60 wt % of PTFE fine particles having a dielectric loss tangent at 40 GHz of 0.0002, 6 wt % of a nonionic surfactant and 34 wt % of water was impregnated/coated onto Quartz Glass Cloth (1) obtained in Preparation Example 1. The moisture was then driven off by 10 minutes of drying in a 100° C. drying furnace, after which the surfactant was removed by 2 minutes of heating in a 280° C. heating furnace. The above steps were carried out a plurality of times until the volume fraction of PTFE in the prepreg reached 60 vol %, thereby producing a prepreg. The prepreg was then molded in a vacuum press for 30 minutes at 380° C. and 1.5 MPa, thereby producing Fluoroplastic Substrate for High-Speed Communications (1).

Fluoroplastic Substrate (1) was a good fluoroplastic substrate that was free of molding defects. As is apparent from the measurement results for dielectric loss tangent and permittivity at 40 GHz shown in Table 4, this substrate had excellent dielectric properties.

Example 2

A prepreg was produced by using the aqueous PTFE dispersion from Example 1 to carry out, as in Example 1, impregnation/coating and heat drying a plurality of times on Quartz Glass Cloth (2) from Preparation Example 2 such as to bring the PTFE volume fraction within the prepreg to 60 vol %. The prepreg was then molded in a vacuum press in the same way as in Example 1, thereby producing Fluoroplastic Substrate for High-Speed Communications (2).

Fluoroplastic Substrate (2) was a good fluoroplastic substrate that was free of molding defects. As is apparent from the measurement results for dielectric loss tangent and permittivity at 40 GHz shown in Table 4, this substrate had excellent dielectric properties.

Example 3

A prepreg was produced by using the aqueous PTFE dispersion from Example 1 to carry out, as in Example 1, impregnation/coating and heat drying a plurality of times on Quartz Glass Cloth (3) from Preparation Example 3 such as to bring the PTFE volume fraction within the prepreg to 60 vol %. The prepreg was then molded in a vacuum press in the same way as in Example 1, thereby producing Fluoroplastic Substrate for High-Speed Communications (3).

Fluoroplastic Substrate (3) was a good fluoroplastic substrate that was free of molding defects. As is apparent from the measurement results for dielectric loss tangent and permittivity at 40 GHz shown in Table 4, this substrate had excellent dielectric properties.

Example 4

A prepreg was produced by using the aqueous PTFE dispersion from Example 1 to carry out, as in Example 1, impregnation/coating and heat drying a plurality of times on Quartz Glass Cloth (4) from Preparation Example 4 such as to bring the PTFE volume fraction within the prepreg to 60 vol %. The prepreg was then molded in a vacuum press in the same way as in Example 1, thereby producing Fluoroplastic Substrate for High-Speed Communications (4).

Fluoroplastic Substrate (4) was a good fluoroplastic substrate that was free of molding defects. As is apparent from the measurement results for dielectric loss tangent and permittivity at 40 GHz shown in Table 4, this substrate had excellent dielectric properties.

Example 5

Silica-Containing PTFE Dispersion (1) was prepared by adding and mixing 60 parts by weight of Low-Dielectric Silica Powder (1) produced in Preparation Example 6 to an equivalent of 100 parts by weight of PTFE resin included in the aqueous PTFE dispersion of Example 1. A prepreg was produced by using this Silica-Containing PTFE Dispersion (1) to carry out, as in Example 1, impregnation/coating and heat drying a plurality of times on Quartz Glass Cloth (1) from Preparation Example 1 such as to bring the PTFE volume fraction within the prepreg to 60 vol %. The prepreg was then molded in a vacuum press in the same way as in Example 1, thereby producing Fluoroplastic Substrate for High-Speed Communications (5).

Fluoroplastic Substrate (5) was a good fluoroplastic substrate that was free of molding defects. As is apparent from the measurement results for dielectric loss tangent and permittivity at 40 GHz shown in Table 4, this substrate had excellent dielectric properties.

Example 6

Silica-Containing PTFE Dispersion (2) was prepared by adding and mixing 60 parts by weight of Low-Dielectric Silica Powder (2) produced in Preparation Example 7 to an equivalent of 100 parts by weight of PTFE resin included in the aqueous PTFE dispersion of Example 1. A prepreg was produced by using this Silica-Containing PTFE Dispersion (2) to carry out, as in Example 1, impregnation/coating and heat drying a plurality of times on Quartz Glass Cloth (1) from Preparation Example 1 such as to bring the PTFE volume fraction within the prepreg to 60 vol %. The prepreg was then molded in a vacuum press in the same way as in Example 1, thereby producing Fluoroplastic Substrate for High-Speed Communications (6).

Fluoroplastic Substrate (6) was a good fluoroplastic substrate that was free of molding defects. As is apparent from the measurement results for dielectric loss tangent and permittivity at 40 GHz shown in Table 4, this substrate had excellent dielectric properties.

Example 7

Two sheets of 25 μm thick adhesive film (1) made of tetrafluoroethylene/perfluoroalkyl vinyl ether copolymer (PFA) (dielectric loss tangent, 0.0008 (40 GHz)), two sheets of low-roughness copper foil (roughness (Rx), 0.6 μm; thickness, 18 μm) and one sheet of the prepreg for Fluoroplastic Substrate for High-Speed Communications (1) produced in Example 1 were stacked in the following order: copper foil/PFA film/fluoroplastic substrate prepreg/PFA film/copper foil, following which the stack was hot-pressed for 30 minutes at 325° C. and 1.5 MPa using a vacuum press, thereby producing Copper-Clad Fluoroplastic Substrate for High-Speed Communications (1).

The resulting Copper-Clad Fluoroplastic Substrate for High-Speed Communications (1) was subjected to etching treatment using a conventional photosensitive resin to remove unnecessary copper foil, thereby creating a circuit board having microstrip lines with a circuit length of 100 mm. This circuit board was used to measure the transmission loss.

In addition, the surface obtained by etching and removing the copper foil from the fluoroplastic substrate and then washing with deionized water and drying was used to measure the dielectric loss tangent at 10 GHz and 40 GHz. Results for the dielectric loss constant and the transmission loss are shown in Table 5.

Example 8

A 25 μm-thick Bonding Film (2) (dielectric loss tangent, 0.0003 (40 GHz)) was produced from a composition of 100 parts by weight of a tetrafluoroethylene/perfluoroalkyl vinyl ether copolymer (PFA), 150 parts by weight of Low-Dielectric Silica Powder (2) from Preparation Example 6 and 2 parts by weight of dicumyl peroxide (available under the trade name Percumyl D from NOF Corporation).

Two sheets of this Bonding Film (2), two sheets of low-roughness copper foil (roughness (Rx), 0.6 μm; thickness, 18 μm), and one sheet of the prepreg for Fluoroplastic Substrate for High-Speed Communications (2) produced in Example 2 were stacked in the following order: copper foil/PFA film/fluoroplastic substrate prepreg/PFA film/copper foil, following which the stack was hot-pressed for 30 minutes at 325° C. and 1.5 MPa using a vacuum press, thereby producing Copper-Clad Fluoroplastic Substrate for High-Speed Communications (2).

The resulting Copper-Clad Fluoroplastic Substrate for High-Speed Communications (2) was subjected to etching treatment using a conventional photosensitive resin to remove unnecessary copper foil, thereby creating a circuit board having microstrip lines with a circuit length of 100 mm. This circuit board was used to measure the transmission loss.

In addition, the surface obtained by etching and removing the copper foil from the fluoroplastic substrate and then washing with deionized water and drying was used to measure the dielectric loss tangent at 10 GHz and 40 GHz. Results for the dielectric loss constant and the transmission loss are shown in Table 5.

Example 9

A 25 μm thick Bonding Film (3) was produced from a composition of 100 parts by weight of the bismaleimide resin SLK-3000 (Shin-Etsu Chemical Co., Ltd; dielectric loss tangent, 0.0014 (40 GHz)), 150 parts by weight of Low-Dielectric Silica Powder (2) from Preparation Example 7 and 2 parts by weight of dicumyl peroxide (available under the trade name Percumyl D from NOF Corporation).

Two sheets of this Bonding Film (3), two sheets of low-roughness copper foil (roughness (Rx), 0.6 μm; thickness, 18 μm), and one sheet of the prepreg for Fluoroplastic Substrate for High-Speed Communications (1) produced in Example 1 were stacked in the following order: copper foil/SLK-3000 film/fluoroplastic substrate prepreg/SLK-3000 film/copper foil, following which a vacuum press was used to carry out a stepped cure, first for 1 hour at 150° C. then for 2 hours at 180° C., thereby producing Copper-Clad Fluoroplastic Substrate for High-Speed Communications (3).

The resulting Copper-Clad Fluoroplastic Substrate for High-Speed Communications (3) was subjected to etching treatment using a conventional photosensitive resin to remove unnecessary copper foil, thereby creating a circuit board having microstrip lines with a circuit length of 100 mm. This circuit board was used to measure the transmission loss.

In addition, the surface obtained by etching and removing the copper foil from the fluoroplastic substrate and then washing with deionized water and drying was used to measure the dielectric loss tangent at 10 GHz and 40 GHz. Results for the dielectric loss constant and the transmission loss are shown in Table 5.

Comparative Example 1

A prepreg was produced by using the aqueous dispersion of PTFE in Example 1 (PTFE resin content, 60 parts by weight) to carry out, as in Example 1, impregnation/coating and heat drying a plurality of times on the quartz glass cloth (SQ1) prior to treatment used in Preparation Example 1 such as to bring the volume fraction of PTFE within the prepreg to 60 vol %. The prepreg was then molded in a vacuum press in the same way as in Example 1, thereby producing Fluoroplastic Substrate (7).

Fluoroplastic Substrate (7) was free of defects. Results for the dielectric loss tangent at 40 GHz and the transmission loss are shown in Table 6.

Comparative Example 2

A prepreg was produced by using the aqueous dispersion of PTFE in Example 1 (PTFE resin content, 60 parts by weight) to carry out, as in Example 1, impregnation/coating and heat drying a plurality of times on Quartz Glass Cloth (5) used in Preparation Example 5 such as to bring the volume fraction of PTFE within the prepreg to 60 vol %. The prepreg was then molded in a vacuum press in the same way as in Example 1, giving Fluoroplastic Substrate (8).

Fluoroplastic Substrate (8) was free of defects. Results for the dielectric loss tangent at 40 GHz and the transmission loss are shown in Table 6.

Comparative Example 3

Fluoroplastic Substrate (9) was produced by stacking two sheets of 40 μm thick tetrafluoroethylene/perfluoroalkyl vinyl ether copolymer (PFA) film (from Daikin Industries, Ltd.; dielectric loss tangent, 0.0009 (40 GHz)) and one sheet of Quartz Glass Cloth (1) obtained in Preparation Example 1 in the following order: PFA film/quartz glass cloth/PFA film, and then hot-pressing the stack for 30 minutes at 325° C. and 1.5 MPa using a vacuum press.

Fluoroplastic Substrate (9) was free of defects. Results for the dielectric loss tangent at 40 GHz and the transmission loss are shown in Table 6.

Comparative Example 4

Fluoroplastic Substrate (10) was produced by stacking two sheets of a 40 μm thick bismaleimide resin (SLK-3000) film (Shin-Etsu Chemical Co., Ltd.; dielectric loss tangent, 0.0014 (40 GHz)) and one sheet of Quartz Glass Cloth (1) obtained in Preparation Example 1 in the following order: SLK-3000 film/quartz glass cloth/SLK-3000 film, and then carrying out a stepped cure consisting of one hour at 150° C. followed by 2 hours at 180° C. using a vacuum press.

Fluoroplastic Substrate (10) was free of defects. Results for the dielectric loss tangent at 40 GHz and the transmission loss are shown in Table 6.

Comparative Example 5

Aside from adding and mixing 150 parts by weight of the silica powder prior to treatment used in Preparation Example 7 (SO-E5 from Admatechs, Ltd.; dielectric loss tangent (40 GHz), 0.0015) to an equivalent of 100 parts by weight of PTFE resin included in the aqueous PTFE dispersion of Example 1, Silica-Containing PTFE Dispersion (3) was prepared in the same way as in Example 5. A prepreg was produced by using Silica-Containing PTFE Dispersion (3) to carry out, as in Example 1, impregnation/coating and heat drying a plurality of times on the quartz glass cloth (SQ1) prior to heat treatment used in Preparation Example 1 such as to bring the PTFE volume fraction within the prepreg to 60 vol %. The prepreg was then molded in a vacuum press in the same way as in Example 1, giving Fluoroplastic Substrate (11).

Fluoroplastic Substrate (11) was free of molding defects. Table 6 shows the results of dielectric loss tangent and permittivity measurements at 40 GHz.

Comparative Example 6

Low-Dielectric Substrate (4) was produced by stacking one sheet of a prepreg for a low-dielectric substrate made of low-dielectric glass cloth having a dielectric loss tangent at 40 GHz of 0.0019 and a thermosetting end-modified polyphenylene ether resin having a dielectric loss tangent at 40 GHz of 0.0015 and two sheets of low-roughness copper foil (roughness (Rx), 0.6 μm; thickness, 18 μm) in the following order: copper foil/low-dielectric substrate prepreg/copper foil, and then hot-pressing the stack for 60 minutes at 180° C. and 2 MPa. The resulting Low-Dielectric Substrate (4) was subjected to etching treatment using a photosensitive resin to remove unnecessary copper foil, thereby creating a circuit board having microstrip lines with a circuit length of 100 mm. This circuit board was used to measure the transmission loss.

In addition, the surface obtained by etching and removing the copper foil from the low-dielectric substrate and then washing with deionized water and drying was used to measure the dielectric loss tangent at 10 GHz and 40 GHz. Results for the dielectric loss constant and the transmission loss are shown in Table 5.

The above results demonstrate that fluoroplastic substrates composed of PTFE resin and quartz glass cloth having the same level of dielectric loss tangent incur little transmission loss, making them suitable as fluoroplastic substrates for high-speed communications. Moreover, adding silica powder having the same level of dielectric loss

TABLE 4

|  | Dielectric properties | Example 1 | Example 2 | Example 3 | Example 4 | Example 5 | Example 6 |
|---|---|---|---|---|---|---|---|
| PTFE | 0.0002 (2.1) | ○ | ○ | ○ | ○ | ○ | ○ |
| PTFE (pbw) |  | — | — | — | — | 100 | 100 |
| Low-Dielectric Silica Powder (1) (pbw) | 0.0003 (3.4) | — | — | — | — | 60 | — |
| Low-Dielectric Silica Powder (2) (pbw) | 0.0002 (3.4) | — | — | — | — | — | 60 |
| Quartz Glass Cloth (1) | 0.0003 (3.3) | ○ | — | — | — | ○ | — |
| Quartz Glass Cloth (2) | 0.0001 (3.3) | — | ○ | — | — | — | ○ |
| Quartz Glass Cloth (3) | 0.0002 (3.3) | — | — | ○ | — | — | — |
| Quartz Glass Cloth (4) | 0.0001 (3.3) | — | — | — | ○ | — | — |
| Fluoroplastic Substrate for High-Speed Communications No. |  | (1) | (2) | (3) | (4) | (5) | (6) |
| Fluoroplastic substrate: Dielectric loss tangent at 40 GHz |  | 0.0003 | 0.0001 | 0.0002 | 0.0001 | 0.0003 | 0.0001 |
| Fluoroplastic substrate: Permittivity at 40 GHz |  | 2.8 | 2.8 | 2.8 | 2.8 | 3.0 | 3.0 |

TABLE 5

|  |  | Example 7 | Example 8 | Example 9 | Comparative Example 6 |
|---|---|---|---|---|---|
| Fluoroplastic Substrate for High-Speed Communications No. |  | (1) | (2) | (1) | — |
| Adhesive Film No. |  | (1) | (2) | (3) | (4) |
| Copper-Clad Substrate No. |  | (1) | (2) | (3) | (4) |
| Dielectric loss tangent | 10 GHz | 0.0003 | 0.0001 | 0.0004 | 0.0022 |
|  | 40 GHz | 0.0004 | 0.0002 | 0.0005 | 0.0031 |
| Transmission loss (dB/100 mm) | 10 GHz | −0.6 | −0.5 | −0.9 | −1.7 |
|  | 40 GHz | −1.2 | −1.0 | −1.8 | −3 | tangent was shown to be effective for further lowering the transmission loss.

Japanese Patent Application No. 2022-102214 is incorporated herein by reference. Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A copper-clad fluoroplastic substrate for high-speed communications comprising:
    a fluoroplastic substrate for high-speed communications, comprising a quartz glass cloth having a dielectric loss tangent at 40 GHz of from 0.0001 to 0.0008 and a fluoroplastic having a dielectric loss tangent at 40 GHz

TABLE 6

|  | Dielectric properties | Comparative Example 1 | Comparative Example 2 | Comparative Example 3 | Comparative Example 4 | Comparative Example 5 |
|---|---|---|---|---|---|---|
| PTFE | 0.0002 (2.1) | ○ | ○ | — | — | ○ |
| PFA | 0.0009 (2.1) | — | — | ○ | — | — |
| SLK-3000 | 0.0014 (2.5) | — | — | — | ○ | — |
| Organic resin (pbw) |  | — | — | — | — | 100 |
| Silica powder SO-E5 (pbw) | 0.0015 (3.4) | — | — | — | — | 150 |
| Quartz glass cloth (SQ1) | 0.0023 (3.3) | ○ | — | — | — | ○ |
| Quartz Glass Cloth (5), Comparative Product | 0.0020 (3.3) | — | ○ | — | — | — |
| Quartz Glass Cloth (1) | 0.0003 (3.3) | — | — | ○ | ○ | — |
| Fluoroplastic Substrate for High-Speed Communications No. |  | (7) | (8) | (9) | (10) *1 | (11) |
| Fluoroplastic substrate: Dielectric loss tangent (40 GHz) |  | 0.0014 | 0.0013 | 0.0009 | 0.0014 | 0.0014 |
| Fluoroplastic substrate: Permittivity (40 GHz) |  | 2.7 | 2.7 | 2.5 | 3.2 | 2.8 |

*1 Bismaleimide resin substrate of from 0.0001 to 0.0005, wherein the substrate has a dielectric loss tangent at 40 GHz of from 0.0001 to 0.0008 and a permittivity at 40 GHz of from 2.0 to 3.2, and a copper foil having a surface roughness of 1.5 μm or less, wherein said fluoroplastic substrate and said copper foil are bonded together by an intervening resin selected from the group consisting of bismaleimide resins and fluoroplastics.

2. The copper-clad fluoroplastic substrate of claim 1, wherein the intervening resin is a tetrafluoroethylene/perfluoroalkoxyethylene copolymer (PFA).

3. The copper-clad fluoroplastic of claim 1, wherein the intervening resin is a bismaleimide resin of the general formula

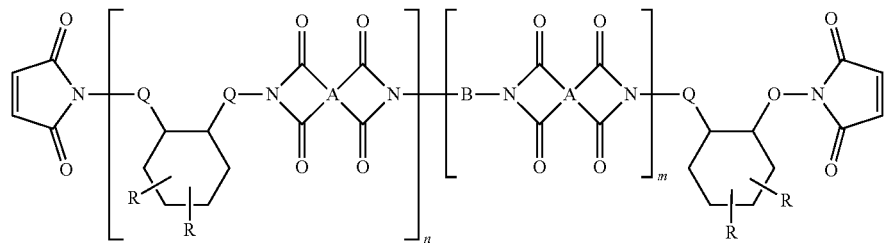

in which each A is independently a tetravalent organic group that includes an aromatic ring or an aliphatic ring, B is a divalent alkylene chain of 6 to 18 carbon atoms which may include a heteroatom and has an aliphatic ring, each Q is independently a linear alkylene group of 6 or more carbon atoms, each R is independently a linear or branched alkyl group of 6 or more carbon atoms, n is a number from 1 to 10, and m is a number from 0 to 10.

* * * * *